(12) United States Patent
Miyamoto et al.

(10) Patent No.: US 11,774,819 B2
(45) Date of Patent: Oct. 3, 2023

(54) ACTIVE MATRIX SUBSTRATE AND LIQUID CRYSTAL DISPLAY DEVICE

(71) Applicant: Sharp Display Technology Corporation, Kameyama (JP)

(72) Inventors: Tadayoshi Miyamoto, Kameyama (JP); Yoshitaka Koyama, Kameyama (JP); Yoshinobu Nakamura, Kameyama (JP); Toshihiro Kaneko, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/095,821

(22) Filed: Jan. 11, 2023

(65) Prior Publication Data

US 2023/0244114 A1 Aug. 3, 2023

(30) Foreign Application Priority Data

Feb. 3, 2022 (JP) ................... 2022-015797

(51) Int. Cl.
*G02F 1/1362* (2006.01)
*H01L 27/12* (2006.01)
*G02F 1/1368* (2006.01)

(52) U.S. Cl.
CPC ...... *G02F 1/136286* (2013.01); *G02F 1/1368* (2013.01); *H01L 27/124* (2013.01); *H01L 27/1225* (2013.01)

(58) Field of Classification Search
CPC .................................................. G02F 1/1362
See application file for complete search history.

(56) References Cited

U.S. PATENT DOCUMENTS

| | | | |
|---|---|---|---|
| 2008/0143664 A1* | 6/2008 | Nakagawa | G02F 1/1368 345/92 |
| 2010/0053486 A1* | 3/2010 | Shim | H01L 27/1255 349/39 |
| 2015/0053989 A1* | 2/2015 | Jeong | H01L 21/76804 438/34 |
| 2017/0170200 A1 | 6/2017 | Ikeda et al. | |
| 2020/0310182 A1* | 10/2020 | Murata | G02F 1/1333 |
| 2020/0373333 A1* | 11/2020 | Liang | H01L 27/124 |
| 2021/0356786 A1* | 11/2021 | Ozeki | G02F 1/1368 |

FOREIGN PATENT DOCUMENTS

JP 2017-167515 9/2017

* cited by examiner

*Primary Examiner* — Sang V Nguyen
(74) *Attorney, Agent, or Firm* — ScienBiziP, P.C.

(57) ABSTRACT

An active matrix substrate includes, in each pixel region, a pixel TFT of an oxide semiconductor layer having source and drain regions, a first insulating layer disposed on top of the oxide semiconductor layer, an extraction electrode, disposed on top of the first insulating layer, that includes a transparent conductive film, and a pixel electrode connected to the extraction electrode. The first insulating layer includes first and second contact holes located above the source and drain regions, respectively. Part of a source bus line overlaps part of the source region and is connected to the source region via the first contact hole. The extraction electrode is connected to the drain region via the second contact hole. Shapes of bottoms of the first and second contact holes are different from each other, and the shape of the bottom of the second contact hole includes two orthogonal sides.

20 Claims, 12 Drawing Sheets

ACTIVE MATRIX SUBSTRATE AND LIQUID CRYSTAL DISPLAY DEVICE

BACKGROUND

1. Field

The present disclosure relates to an active matrix substrate and a liquid crystal display device.

2. Description of the Related Art

Display devices such as liquid crystal display devices and organic EL devices are used as various types of image display device and, for example, are used in head-mounted displays as well. In general, a head-mounted display is disposed right in front of the eyes like glasses; therefore, the distance between the display device and the eyes is so short that the display device need to have very high resolution (e.g. higher than or equal to 1000 ppi).

Since the head-mounted display is worn on the head, it is preferable that the head-mounted display be driven by an internal electrical power source. For this reason, it is preferable that TFTs each having an oxide semiconductor layer that is superior in low-leak performance be used as TFTs that drive pixels. For example, Japanese Unexamined Patent Application Publication No. 2017-167515 discloses such a liquid crystal display device.

Further improvement in display quality of a head-mounted display is desired. Specifically, a display with higher contrast is desired. It is desirable to provide an active matrix substrate and a liquid crystal display device that are capable of performing a display with higher contrast.

SUMMARY

According to an aspect of the disclosure, there is provided an active matrix substrate including a substrate having a display region including a plurality of pixel regions and a non-display region provided around the display region, a plurality of source bus lines extending in a first direction in the display region, and a plurality of gate bus lines extending in a second direction intersecting the first direction. The active matrix substrate further includes, in each of the pixel regions, a pixel TFT including an oxide semiconductor layer having a source region and a drain region, a first insulating layer disposed to cover at least the oxide semiconductor layer, an extraction electrode, disposed on top of the first insulating layer, that includes a transparent conductive film, and a pixel electrode disposed above the extraction electrode and electrically connected to the extraction electrode. The first insulating layer includes a first contact hole located above the source region and a second contact hole located above the drain region. Part of one of the plurality of source bus lines overlaps part of the source region and is connected to the source region of the oxide semiconductor layer via the first contact hole. The extraction electrode is connected to the drain region of the oxide semiconductor layer via the second contact hole. A shape of a bottom of the first contact hole is different from a shape of a bottom of the second contact hole, and the shape of the bottom of the second contact hole includes two orthogonal sides.

DESCRIPTION OF THE EMBODIMENTS

Figure 1:
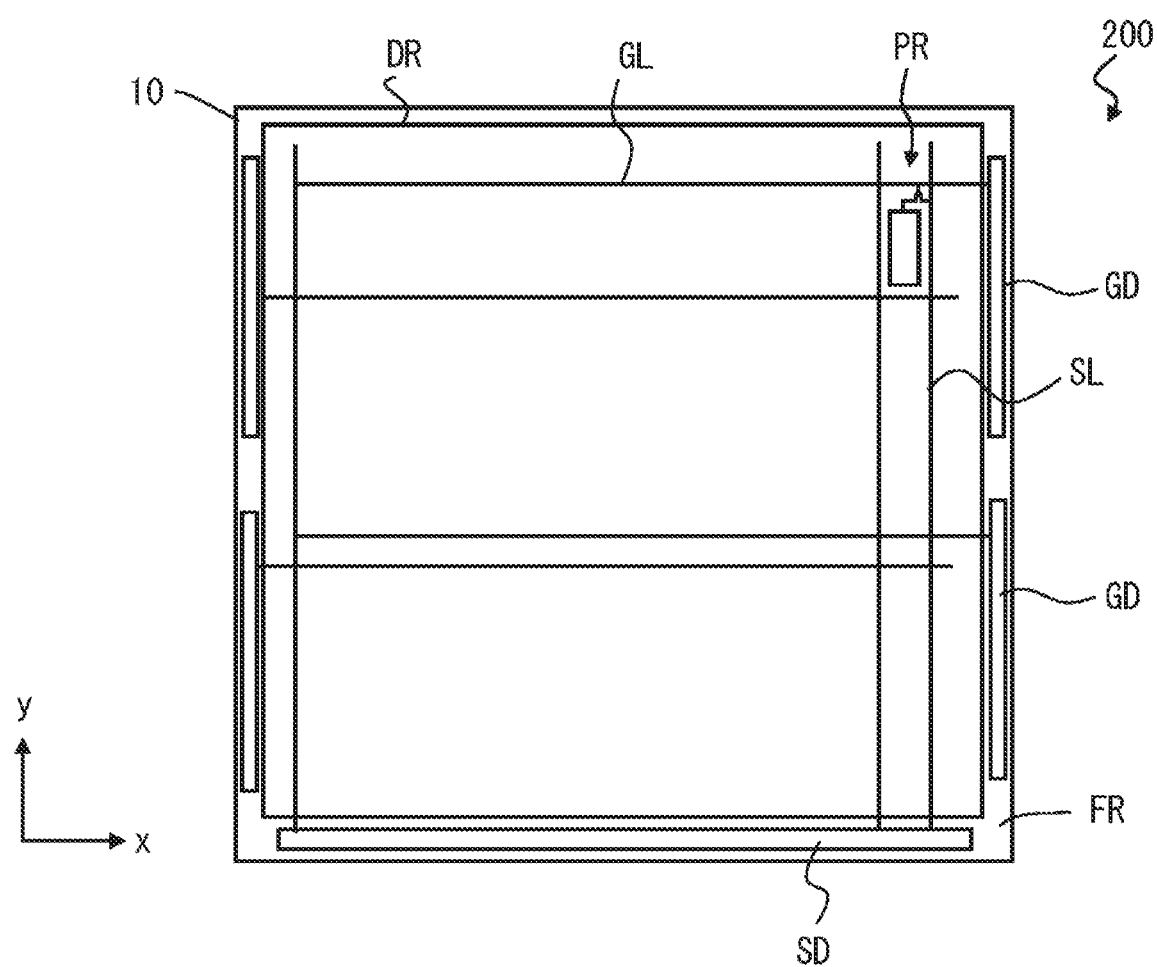
FIG. 1 is a schematic view showing an example of a planar structure of an active matrix substrate according to a first embodiment.

In achieving a display device with an ultrahigh resolution of, for example, 1000 ppi or higher, it is preferable that the luminance of a white display be increased by increasing the aperture ratio, as the size of each pixel is small. For example, it is conceivable that the transparency of an oxide semiconductor may be utilized to connect a pixel electrode and an oxide semiconductor layer to each other by a transparent extraction electrode via a contact hole.

However, the inventors studied the display quality of a display device having such a structure and found that light leaks through a contact hole during a black display and a sufficiently low black luminance is not attained.

In view of such a problem, the inventors thought of an active matrix substrate having a novel structure. The following describes embodiments of the present disclosure with reference to the drawings. The present disclosure is not limited to the following embodiments but is subject to design change as appropriate within the range of fulfillment of a configuration of the present disclosure. Further, in the following description, identical portions or portions having similar functions are given identical signs that are adhered to throughout different drawings, and a repeated description of such portions may be omitted. Further, configurations described in the embodiments and modifications man be combined or changed without departing from the scope of the present disclosure. For the sake of clarity of explanation, the drawings to be referred to below show configurations in a simplistic or schematic form or omit some constituent members. Further, the dimensional ratios between constituent members shown in the drawings do not necessarily represent actual dimensional ratios. The terms "orthogonal" and "parallel" encompass not only a case where sides or surfaces are disposed strictly at an angle of 90 degrees or 180 degrees to each other but also a case where two sides, two surfaces, or a side and a surface are disposed in an allowable range of errors (e.g. approximately ±3 degrees), i.e. in a range of, for example, 87 degrees to 93 degrees and 177 degrees to 183 degrees.

First Embodiment

FIG. 1 is a schematic view showing an example of a planar structure of an active matrix substrate 200 according to the present embodiment. The active matrix substrate 200 includes a substrate 10 whose principal surface includes a display region DR and a non-display region FR other than the display region DR. The display region DR includes a plurality of pixel regions PR arrayed in a matrix in an x direction (second direction) and a y direction (first direction) orthogonal to the x direction. The non-display region FR is a region, located at the outer edge of the display region DR, that does not contribute to a display.

The active matrix substrate 200 includes a plurality of source bus lines SL and a plurality of gate bus lines GL. For example, the plurality of source bus lines SL extend in the y direction, and the plurality of gate bus lines GL extend in the x direction.

In each of the pixel regions PR, the active matrix substrate 200 further includes a pixel TFT 101 and a pixel electrode PE.

Figure 2:
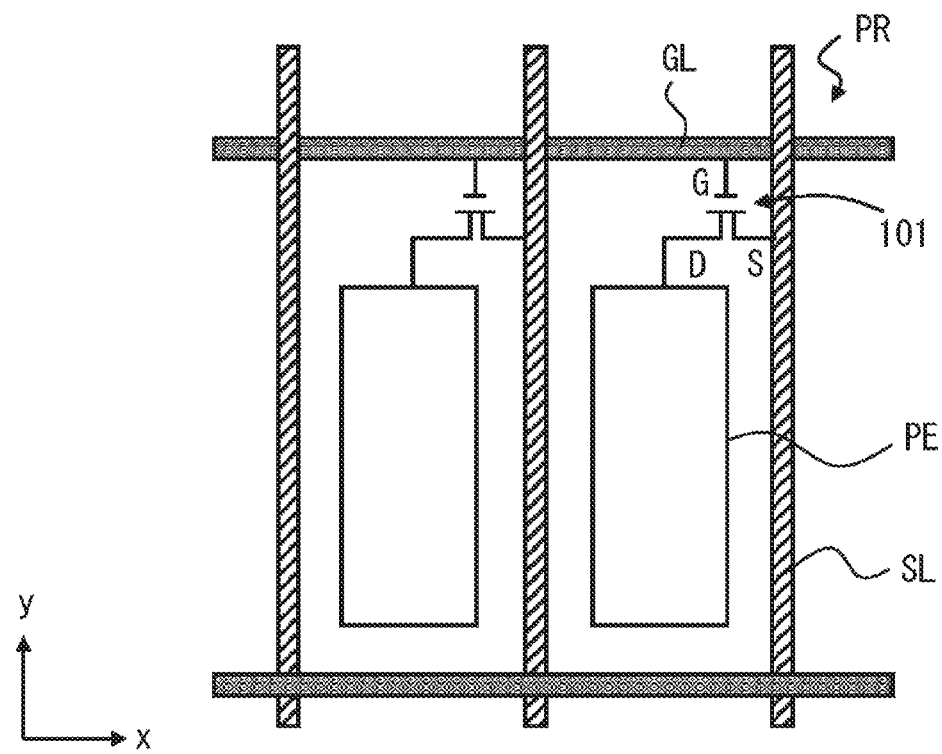
FIG. 2 is an enlarged schematic view showing a planar structure of a pixel region of the active matrix substrate.

FIG. 2 is an enlarged schematic view showing a planar structure of a pixel region PR of the active matrix substrate 200. As shown in FIG. 2, in each of the pixel regions PR, the pixel TFT 101 has its gate electrically connected to one of the plurality of gate bus lines GL, and has its source electrically connected to one of the plurality of source bus lines SL. The pixel TFT 101 has its drain electrically connected to a pixel electrode PE. The gates of pixel TFTs 101 located in a plurality of pixel regions PR arrayed in the x direction are connected to the same gate bus line GL, and the sources of pixel TFTs 101 located in a plurality of pixel regions PR arrayed in the y direction are connected to the same source bus lines SL (FIG. 1).

The active matrix substrate 200 further includes a driving circuit, located in the non-display region FR of the substrate 10, that includes a gate driver GD and a source driver SD.

As mentioned above, in a case where the active matrix substrate 200 is used, for example, in a display device for use as a head-mounted display, it is preferable that TFTs each having an oxide semiconductor layer that is superior in low-leak performance be used as TFTs that drive pixels. Meanwhile, it is preferable that the driving circuit be constituted by TFTs each having a high driving current. For example, it is preferable that the driving circuit include a plurality of TFTs each having a low-temperature polysilicon (polycrystalline silicon) semiconductor layer.

Figure 3:
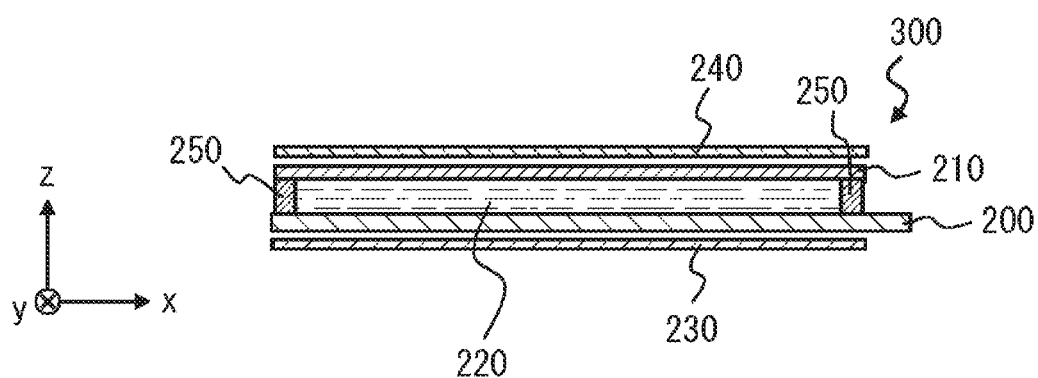
FIG. 3 is a schematic cross-sectional view showing an example configuration in which the active matrix substrate is applied to a liquid crystal display device.

FIG. 3 is a schematic cross-sectional view showing an example configuration in which the active matrix substrate 200 is applied to a liquid crystal display device 300. The liquid crystal display device 300 includes the active matrix substrate 200, a counter substrate 210, a liquid crystal layer 220, a polarizing plate 230, and a polarizing plate 240.

The counter substrate 210 is disposed at a predetermined distance formed by spacers 250 from a principal surface of the active matrix substrate 200, and the liquid crystal layer 220 is located between the active matrix substrate 200 and the counter substrate 210. The polarizing plate 230 and the polarizing plate 240 face each other across at least the liquid crystal layer 220. More specifically, the polarizing plate 230 and the polarizing plate 240 are located so that the counter substrate 210, the liquid crystal layer 220, and the active matrix substrate 200 be sandwiched between the polarizing plate 230 and the polarizing plate 240.

The pair of polarizing plates 230 and 240 are under crossed-nicols arrangement. For example, the transmission axis (polarizing axis) of the polarizing plate 230 is parallel to the x direction, and the transmission axis (polarizing axis) of the polarizing plate 240 is parallel to the y direction. Accordingly, linearly polarized light having passed through the polarizing plate 230 falls on the active matrix substrate 200.

Figure 4:
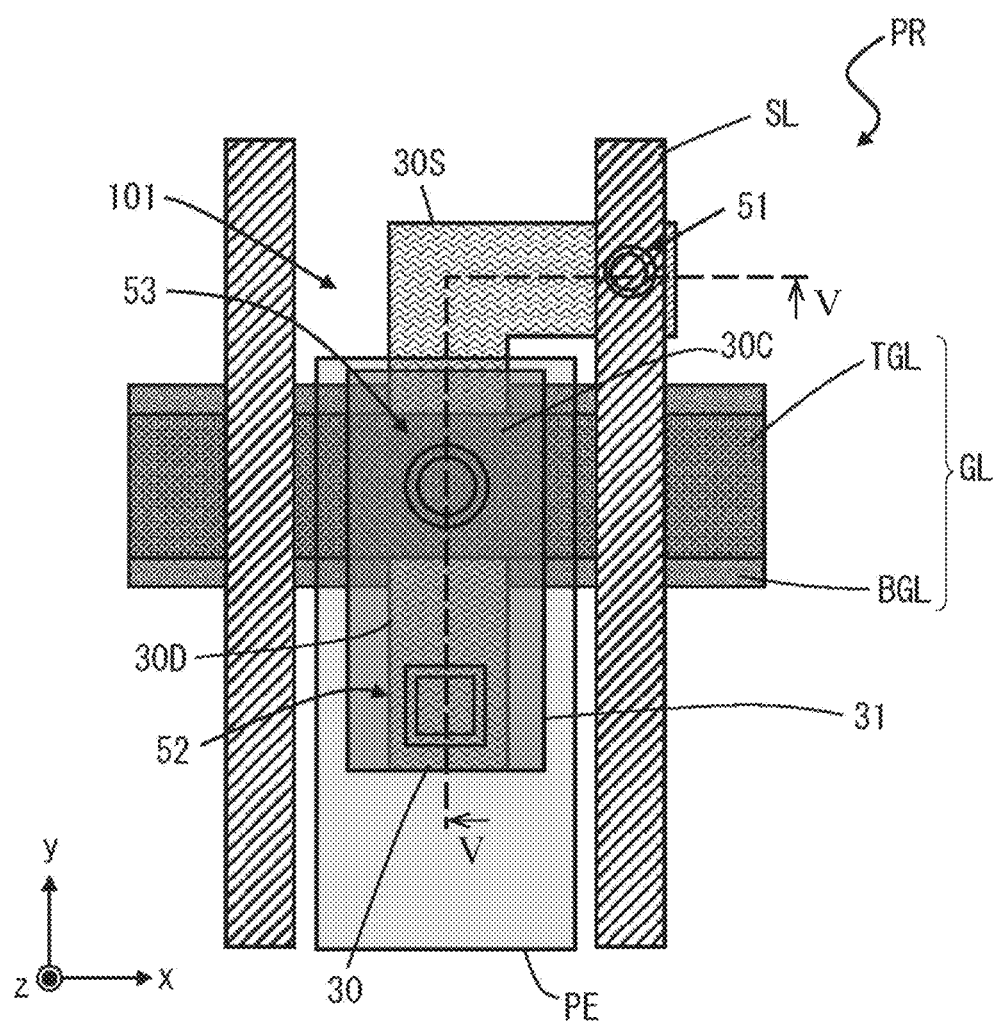
FIG. 4 is a plan view showing a structure of the active matrix substrate in each pixel region.
Figure 5:
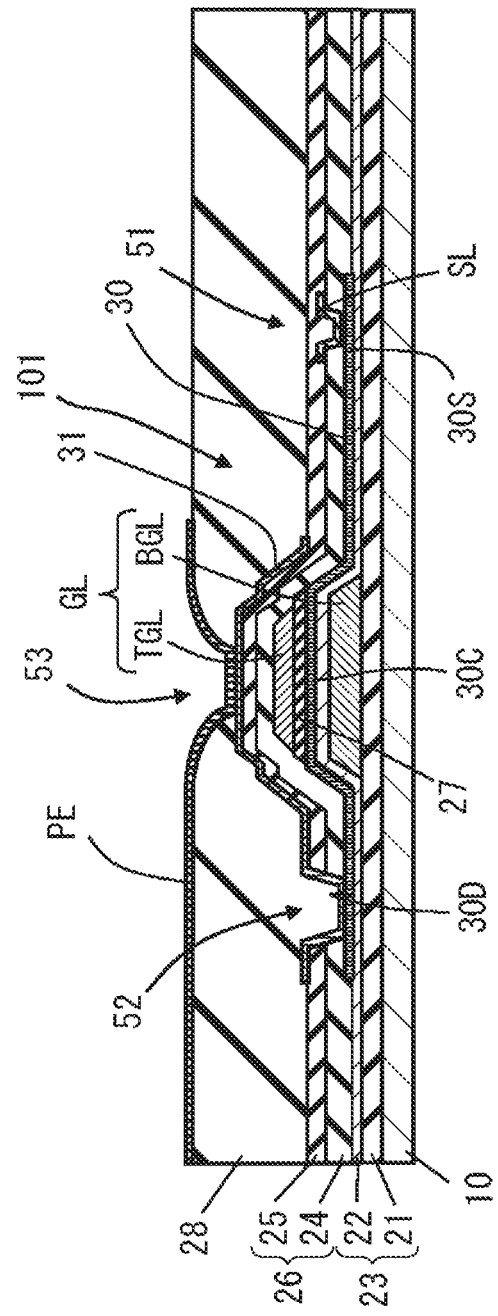
FIG. 5 is a schematic view showing a structure of the active matrix substrate as taken along line V-V in in FIG. 4.

FIG. 4 is a plan view showing a structure of the active matrix substrate 200 in each of the pixel regions PR, and FIG. 5 is a schematic view showing a structure of the active matrix substrate 200 as taken along line V-V in in FIG. 4. For the sake of clarity of an overlap between constituent elements, FIG. 4 shows some constituent elements so that structures below the constituent elements can be seen. Further, FIG. 4 does not show insulating layers.

In each of the pixel regions PR, the active matrix substrate 200 includes the aforementioned pixel TFT 101, a foundation insulating layer 23, a first insulating layer 26, a gate insulating layer 27, a second insulating layer 28, an extraction electrode 31, and a pixel electrode PE. Further, the pixel TFT 101 includes an oxide semiconductor layer 30 and a gate electrode serving as part of the gate bus line GL.

The substrate 10 is for example a glass substrate having translucency. The term "translucency" used herein means transmission of light at least in a band of wavelength of visible light. The foundation insulating layer 23 includes, for example, a basecoat film 21 and a foundation film 22. The basecoat film 21 has insulation properties, and is disposed on top of the principal surface of the substrate 10.

The pixel TFT 101 according to the present embodiment has a double-gate structure having gate electrodes above and below the oxide semiconductor layer 30, respectively. For this reason, the plurality of gate bus lines GL include a plurality of top-gate bus lines TGL and a plurality of bottom-gate bus lines BGL. In a plan view, one of the plurality of top-gate bus lines TGL is located above and overlaps one of the plurality of bottom-gate bus lines BGL.

As shown in FIGS. 4 and 5, the top-gate bus line TGL is located in a higher position than the oxide semiconductor layer 30, the bottom-gate bus line BGL is located in a lower position than the oxide semiconductor layer 30. More specifically, the bottom-gate bus line BGL is disposed on top of the basecoat film 21, and the foundation film 22 is disposed on top of the basecoat film 21 so as to cover the bottom-gate bus line BGL. The basecoat film 21 is composed, for example, of a silicon oxide film having a thickness of 100 nm and a silicon nitride film, located on top of the silicon oxide film, that has a thickness of 200 nm.

In a plan view, the oxide semiconductor layer 30 is disposed so as to intersect the bottom-gate bus line BGL. The oxide semiconductor layer 30 includes a channel region 30C, a source region 30S, and a drain region 30D. The channel region 30C is located on top of the bottom-gate bus line BGL. Meanwhile, the source region 30S and the drain region 30D are each adjacent to the channel region 30C, and are located in regions other than the region above the bottom-gate bus line BGL.

The oxide semiconductor layer 30 may be an amorphous oxide semiconductor or may be a crystalline oxide semiconductor having a crystalline portion. Examples of the crystalline oxide semiconductor include a polycrystalline oxide semiconductor, a microcrystalline oxide semiconductor, and a crystalline oxide semiconductor whose c axis is aligned substantially perpendicularly to a layer surface.

The oxide semiconductor layer 30 may be a single layer, or may have a stack structure of two or more layers. In a case where the oxide semiconductor layer 30 has a stack structure, the oxide semiconductor layer 30 may include an amorphous oxide semiconductor layer and a crystalline oxide semiconductor layer. Alternatively, the oxide semiconductor layer 30 may include a plurality of crystalline oxide semiconductor layers of different crystal structures. Further, the oxide semiconductor layer 30 may include a plurality of amorphous oxide semiconductor layers. In a case where the oxide semiconductor layer 30 has a two-layer structure including an upper layer and a lower layer, it is preferable that the energy gap of an oxide semiconductor contained in the upper layer be greater than the energy gap of an oxide semiconductor contained in the lower layer. Note, however, that in a case where the difference in energy gap between these layers is comparatively small, the energy gap of the oxide semiconductor of the lower layer may be greater than the energy gap of the oxide semiconductor of the upper layer. The oxide semiconductor layer 30 is described in detail, for example, in Japanese Unexamined Patent Application Publication No. 2014-007399.

The oxide semiconductor layer 30 may contain at least one type of metal element of, for example, In, Ga, and Zn. In the present embodiment, the oxide semiconductor layer 30 contains, for example, an In—Ga—Zn—O semiconductor (e.g. indium-gallium-zinc oxide). Note here that an In—Ga—Zn—O semiconductor is a ternary oxide of In (indium), Ga (gallium), and Zn (zinc), and examples of proportions (composition ratios) of In, Ga, and Zn include, but are not limited to, In:Ga:Zn=2:2:1, In:Ga:Zn=1:1:1, and In:Ga:Zn=1:1:2. Such an oxide semiconductor layer 30 may be formed from an oxide semiconductor film containing an In—Ga—Zn—O semiconductor.

The oxide semiconductor layer 30 may contain another oxide semiconductor instead of the In—Ga—Zn—O semiconductor. For example, the oxide semiconductor layer 30 may contain an In—Sn—Zn—O semiconductor (e.g. $In_2O_3$—$SnO_2$—ZnO; InSnZnO). The In—Sn—Zn—O semiconductor is a ternary oxide of In (indium), Sn (tin), and Zn (zinc). Alternatively, the oxide semiconductor layer 30 may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, or other semiconductors.

The source region 30S and the drain region 30D have electrical conductivity. The source region 30S and the drain region 30D may be formed, for example, by using the bottom-gate bus line BGL as a mask, irradiating the oxide semiconductor layer 30 with laser light from the direction of the substrate 10, and making the oxide semiconductor lower in resistance. Alternatively, the source region 30S and the drain region 30D may be formed by subjecting the oxide semiconductor to argon plasma treatment, or the source region 30S and the drain region 30D may be formed by forming an Al film on the oxide semiconductor and causing them to react with each other.

The gate insulating film 27 is located on top of the channel region 30C. The gate insulating film 27 is for example a silicon oxide film with a thickness of 100 nm. Further, the top-gate bus line TGL is located in a position on top of the gate insulating layer 27 and on top of the foundation film 22 that overlaps the bottom-gate bus line BGL in plan view.

The first insulating layer 26 includes an interlayer insulating film 24 and a protective film 25. The interlayer insulating film 24 is disposed on top of the foundation film 22 to cover the top-gate bus line TGL and a portion of the oxide semiconductor layer 30 exposed from the top-gate bus line TGL.

The source bus line SL is located on top of the interlayer insulating film 24. As will be described in detail below, part of the source bus line SL overlaps part of the source region 30S in plan view. Further, the source bus line SL is connected to the source region 30S of the oxide semiconductor layer 30 via a first contact hole 51 provided in the interlayer insulating film 24.

The protective film 25 is located on top of the interlayer insulating film 24 to cover the source bus line SL. The protective film 25 is composed, for example, of a silicon nitride film with a thickness of 100 nm and a silicon oxide film with a thickness of 250 nm.

The extraction electrode 31 is located on top of the protective film 25. Part of the extraction electrode 31 overlaps the drain region 30D in plan view. Further, in the present embodiment, another part of the extraction electrode 31 overlaps the top-gate bus line TGL. The extraction electrode 31 is constituted by a transparent conductive film such as an ITO film. The extraction electrode 31 is connected to the drain region 30D of the oxide semiconductor layer 30 via a second contact hole 52 provided in the interlayer insulating film 24 and the protective film 25, i.e. in the first insulating layer 26.

The second insulating layer 28 is located on top of the first insulating layer 26 to cover the extraction electrode 31. The second insulating layer 28 is an organic insulating film such as a photosensitive acrylic resin film.

The pixel electrode PE is located on top of the second insulating layer 28. In the present embodiment, part of the pixel electrode PE overlaps the extraction electrode 31 and the top-gate bus line TGL in plan view. A third contact hole 53 is disposed in a portion of the second insulating layer 28 sandwiched between the pixel electrode PE and the extraction electrode 31 and located above the top-gate bus line TGL. The pixel electrode PE is connected to the extraction electrode 31 via the third contact hole 53. The pixel electrode PE is constituted by a transparent conductive film such as an ITO film.

Next, the shapes of the first contact hole 51, the second contact hole 52, and the third contact hole 53 are described. In the active matrix substrate 200 according to the present embodiment, the shape of a bottom of the first contact hole 51 is different from the shape of a bottom of the second contact hole 52.

Figure 6:
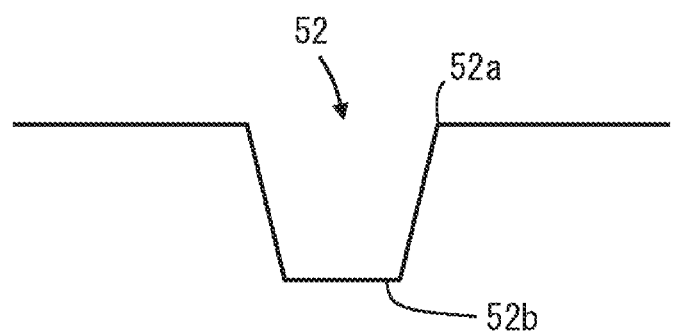
FIG. 6 schematically shows a cross-section of a second contact hole perpendicular to the substrate.
Figure 11:
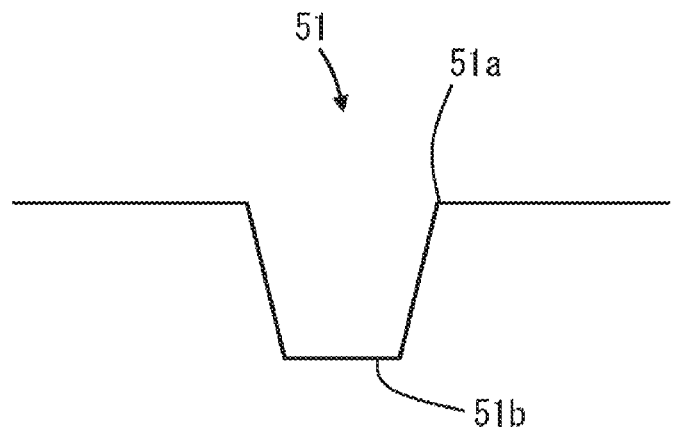
FIG. 11 schematically shows a cross-section of a first contact hole perpendicular to the substrate.
Figure 12:
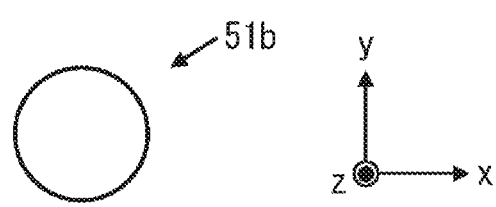
FIG. 12 shows an example of the shape of a bottom of the first contact hole in plan view.

FIG. 6 schematically shows a cross-section of the second contact hole 52 perpendicular to the substrate 10, and FIGS. 7 to 10 each schematically shows the shape of the bottom of the second contact hole 52 in plan view. Further, FIG. 11 schematically shows a cross-section of the first contact hole 51 perpendicular to the substrate 10, and FIGS. 12 and 13 each schematically show the shape of the bottom of the first contact hole 51 in plan view.

The second contact hole 52 has an inverted taper shape whose bottom 52b is smaller than an opening 52a. Further, the bottom 52b has a shape including two orthogonal sides. In the example shown in FIG. 7, the shape of the bottom 52b is a rectangle. The rectangle may be a square or may be an oblong. It is preferable that two orthogonal sides 52c and 52d be parallel to the transmission axis (x axis) of the polarizing plate 230 and the transmission axis (y axis) of the polarizing plate 240, respectively. The term "side" here means a straight segment and does not encompass a curve.

Figure 7:
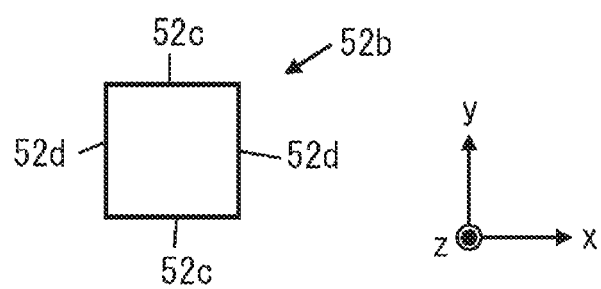
FIG. 7 shows an example of the shape of a bottom of the second contact hole in plan view.

Although FIG. 7 or other drawings clearly show the vertices of the shape of the bottom 52b, the bottom 52b may not have clear vertices and may have round corners. In this case, it is preferable that the total length Ls of straight portions of the shape of the bottom 52b be longer than the total length Lc of curved portions (Ls>Lc). More preferably, the relationship Ls>2Lc is satisfied.

Figure 8:
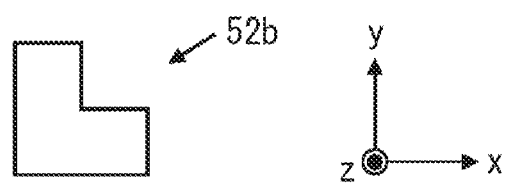
FIG. 8 shows an example of the shape of the bottom of the second contact hole in plan view.
Figure 9:
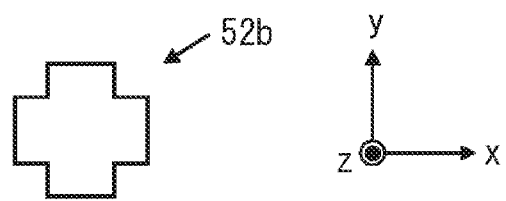
FIG. 9 shows an example of the shape of the bottom of the second contact hole in plan view.
Figure 10:
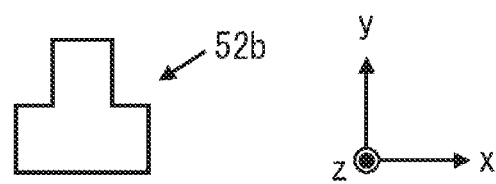
FIG. 10 shows an example of the shape of the bottom of the second contact hole in plan view.

The bottom 52b shown in FIG. 8 has a shape obtained by cutting one corner of the rectangle into a rectangle. Further, the bottom 52b shown in FIG. 9 has a shape obtained by cutting each of the four corners of the rectangle into a rectangle. Further, the bottom 52b shown in FIG. 10 has a shape obtained by cutting each of two adjacent ones of the four corners of the rectangle into a rectangle. Thus, it is preferable that the shape of the bottom 52b be constituted solely by orthogonal sides or parallel sides.

It is preferable that the opening 52a of the second contact hole 52 also have a shape that is similar to that of the bottom 52b. That is, it is preferable that the shape of the opening 52a and the shape of the bottom 52b be analogous to each other. Further, it is preferable that the shape of the opening 52b be larger than the shape of the bottom 52b.

Figure 13:
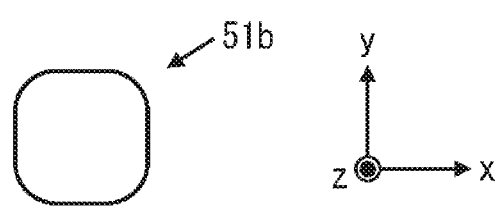
FIG. 13 shows an example of the shape of the bottom of the first contact hole in plan view.

The first contact hole 51 too has an inverted taper shape whose bottom 51b is smaller than an opening 51a. Further, the bottom 51b has, for example, a circular shape. The circular shape of the bottom 51b may be slightly deformed. That is, the bottom 51b may have an elliptical shape, or like an oval shape, the shape of the bottom 51b may include straight portions as shown in FIG. 13. In this case, it is preferable that the total length Lc of curved portions of the shape of the bottom 51b be longer than the total length Ls of straight portions (Lc>Ls). More preferably, the relationship Lc>2Ls is satisfied.

The shape of the third contact hole 53 may be similar to the shape of the first contact hole 51 or may be similar to the shape of the second contact hole 52. The term "similar" here means that shapes are analogous to or resemble each other, and the sizes may be the same or may be different.

The active matrix substrate 200 according to the present embodiment, in which the second contact hole 52 includes the aforementioned shape, reduces leakage of light through the contact hole during a black display. A reason for this is described in detail.

Figure 14:
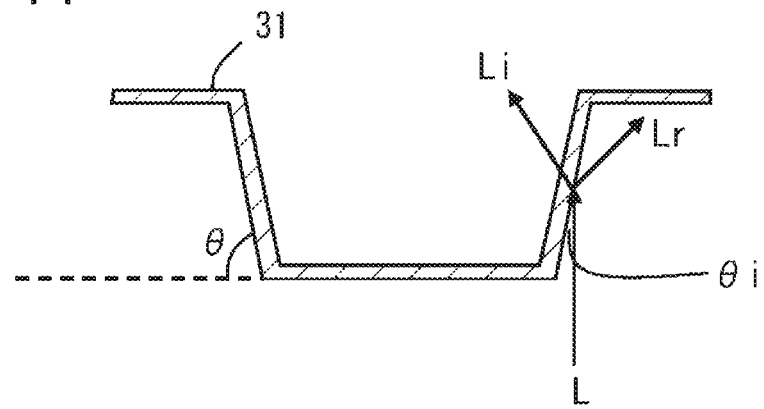
FIG. 14 is a schematic view for explaining how light L from a backlight enters with a transparent extraction electrode disposed in a contact hole.

As mentioned above, in increasing the aperture ratio of a display device by causing light to also pass through the oxide semiconductor layer of a pixel TFT, it is conceivable to employ a structure in which a pixel electrode and the oxide semiconductor layer are connected to each other by a transparent extraction electrode via a contact hole. FIG. 14 is a schematic view for explaining how light L from a backlight enters with a transparent extraction electrode 31 disposed in a contact hole. The light L from the backlight falls on the extraction electrode 31 at a low angle of incidence ei on a side wall of the contact hole. Part of the light L turns into reflected light Lr by being totally reflected off the side wall, and the remaining light turns into incident light Li that travels into the contact hole.

Figure 15:
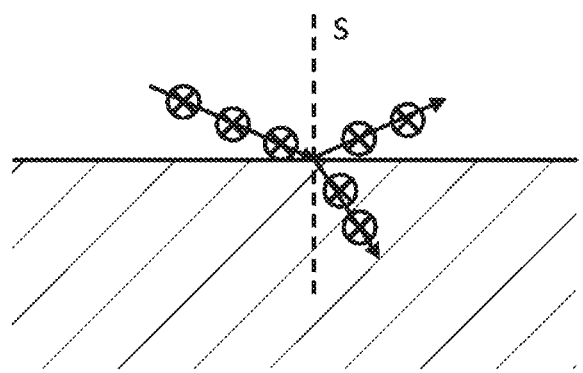
FIG. 15 is a schematic view explaining reflected light and transmitted light in a case where S-polarized light falls on an interface.
Figure 16:
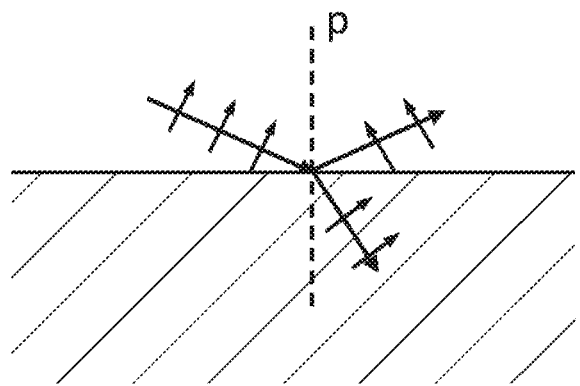
FIG. 16 is a schematic view explaining reflected light and transmitted light in a case where P-polarized light falls on the interface.

At this point in time, the transmittance and reflectance of the extraction electrode 31 on the side wall vary depending on whether the light L is S-polarized light or P-polarized light. As shown in FIG. 15, light having an electric field in a direction parallel with an interface perpendicular to the surface of paper is S-polarized light. As shown in FIG. 16, light having an electric field in a direction parallel with a plane including incident light and reflected light is P-polarized light.

Figure 17:
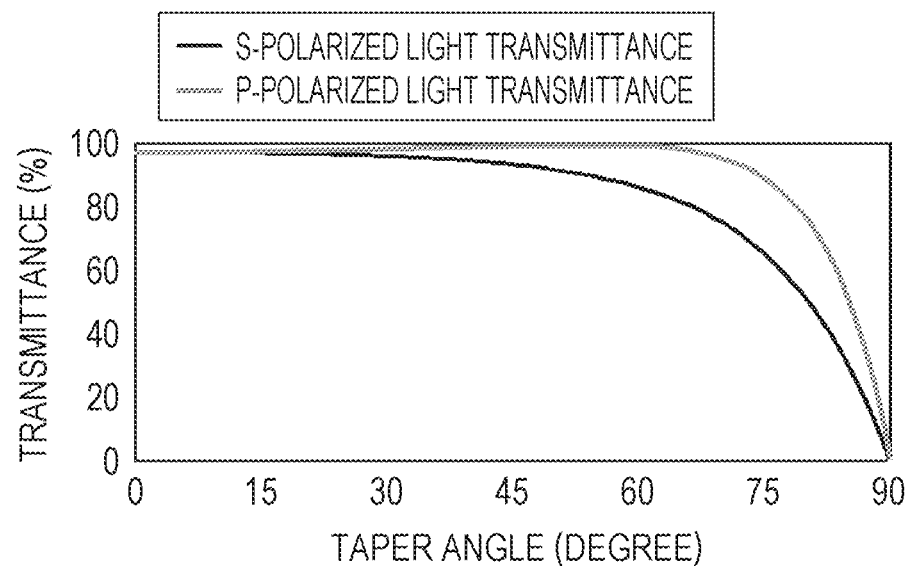
FIG. 17 shows the dependence of the transmittances of S-polarized light and P-polarized light on the taper angle $\theta$ of a contact hole.

FIG. 17 shows the dependence of the transmittances of S-polarized light and P-polarized light on the taper angle θ of a contact hole. As shown in FIG. 14, the taper angle θ is defined by an angle formed by the side wall with respect to a horizontal direction, and satisfies the relationship θ+θi=90 degrees. The result shown in FIG. 17 was obtained by performing a calculation on the basis of Fresnel's formula on the assumption that the refractive index of an external medium of the contact hole is 1.45 and the interior of the contact hole is constituted by a medium with a refractive index of 2.00. As shown in FIG. 17, the transmittances of S-polarized light and P-polarized light are both substantially 100% when the taper angle θ is 0 degree. The transmittance of the P-polarized light remains substantially 100% until the taper angle θ reaches approximately 60 degrees, starts to decrease when the taper angle θ exceeds 60 degrees, and comes to decrease at a higher rate when the taper angle θ exceeds 80 degrees. The transmittance is 0% when the taper angle θ is 90 degrees. Meanwhile, the transmittance of the S-polarized light starts to decrease when the taper angle θ exceeds 15 degrees, and comes to decrease at a higher rate when the taper angle θ exceeds 80 degrees. The transmittance is 0% when the taper angle θ is 90 degrees.

Figure 18:
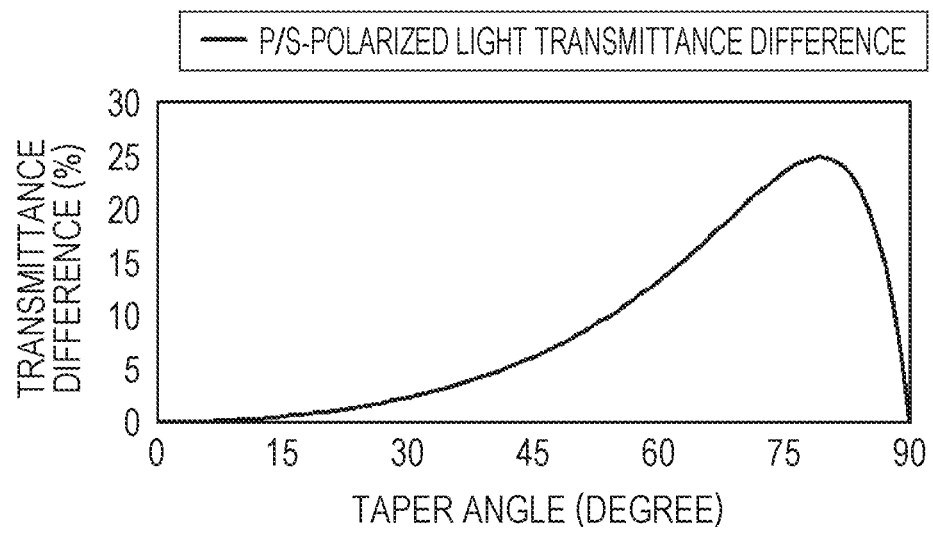
FIG. 18 shows the dependence of the transmittance difference between the S-polarized light and the P-polarized light on the taper angle $\theta$.

FIG. 18 shows the dependence of the transmittance difference between the S-polarized light and the P-polarized light on the taper angle θ. The transmittance difference between the S-polarized light and the P-polarized light reaches its maximum, whose value is approximately 25%, when the taper angle θ is approximately 80 degrees. FIG. 18 means that in a case where light passes through an extraction electrode formed on a side wall of a contact hole, the proportions of the S-polarized light and the P-polarized light may change and that the rate of the change depends on the taper angle θ and reaches its maximum in a case where the taper angle θ is approximately 80 degrees. Although the value of the transmittance depends on the refractive index difference between two media between which the interface is sandwiched, the refractive index difference is considered to have an insignificant effect on the dependence of the transmittance difference on the taper angle θ.

Figure 19:
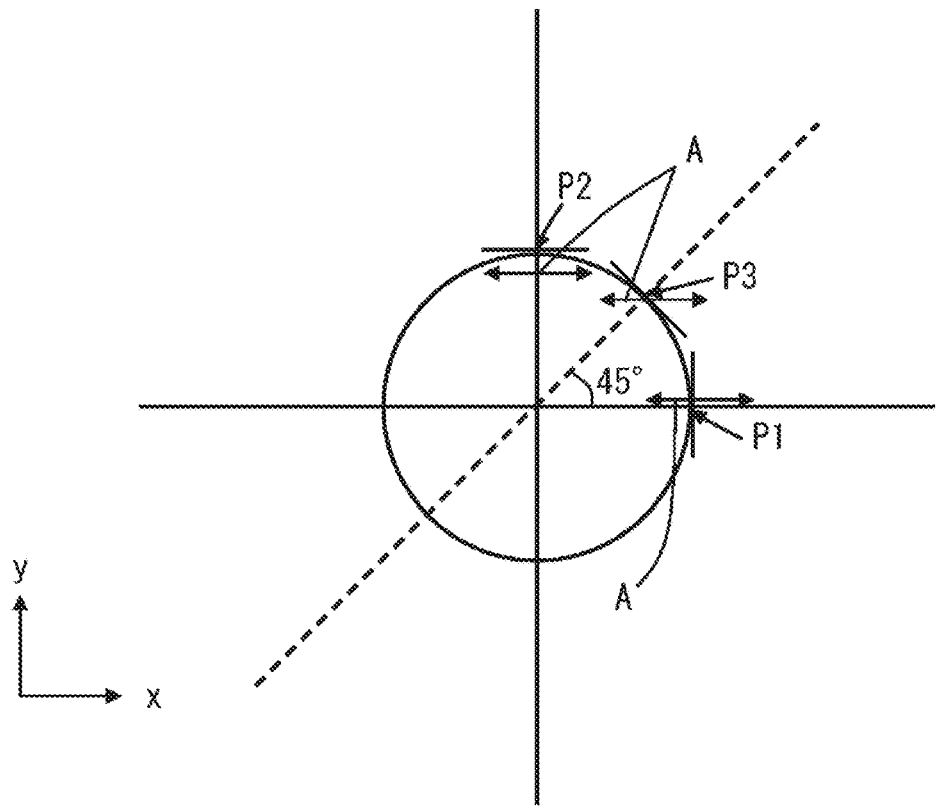
FIG. 19 shows a relationship between an incident interface formed by an extraction electrode on a side wall and the polarizing axis of incident light in a case where a bottom of a contact hole has a circular shape.

FIG. 19 shows a relationship between an incident interface formed by an extraction electrode on a side wall and the polarizing axis of incident light in a case where a bottom of a contact hole has a circular shape. As shown in FIG. 19, the incident light has a polarizing axis A parallel to the x axis, for example, by passing through a polarizing plate having a transmission axis parallel to the x axis. In FIG. 19, at a position P1, in a case where light falls on the extraction electrode on the contact hole side wall, the incident interface is perpendicular to the polarizing axis of the light. For this reason, the incident light contains only a P-polarized light component and does not contain an S-polarized light component. As a result of that, even when there is such a transmittance difference between S-polarized light and P-polarized light as that shown in FIG. 18, the light having passed through the extraction electrode contains only a P-polarized light component and does not contain an S-polarized light component.

Similarly, at a position P2, in a case where light falls on the extraction electrode on the contact hole side wall, the incident interface is parallel to the polarizing axis A of the light. For this reason, the incident light contains only an S-polarized light component and does not contain a P-polarized light component. Further, the light having passed through the extraction electrode contains only an S-polarized light component and does not contain a P-polarized light component.

Meanwhile, at a position P3, in a case where light falls on the extraction electrode on the contact hole side wall, the incident interface is at an angle of 45 degrees with respect to the polarizing axis A of the light.

Figure 20:
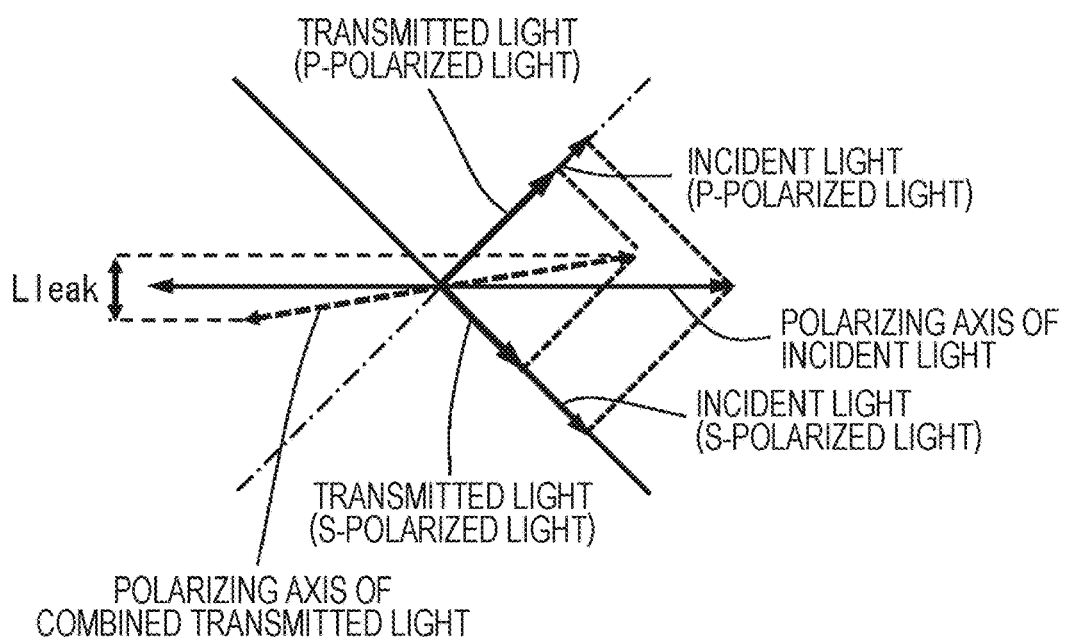
FIG. 20 is a schematic view explaining the polarizing axes of light falling on and light having passed through a contact hole at a position P3.

FIG. 20 is a schematic view explaining the polarizing axes of light falling on and light having passed through a contact hole at the position P3. As shown in FIG. 20, the incident light contains P-polarized and S-polarized light components of the same magnitude. However, as shown in FIG. 18, at the incident interface, in a case where the taper angle θ is for example approximately 80 degrees, the transmittance of the P-polarized light component is higher than the transmittance of the S-polarized light component by approximately 25%. For this reason, the P-polarized light component contained in the transmitted light is greater than the S-polarized light component by approximately 25%.

Accordingly, the polarizing axis of the transmitted light obtained by combining the P-polarized light component and the S-polarized light component rotates from the polarizing axis of the incident light. The polarizing plate situated in front of the display device has a transmission axis in a direction orthogonal to the polarizing axis of the incident light; therefore, as shown in FIG. 20, the transmitted light has a component Lleak that passes through the transmission axis. This causes leakage of light during a black display.

This leakage of light during a black display can be reduced simply by causing the side wall of the contact hole to be constituted by a surface orthogonal or parallel to the polarizing axis of the incident light, i.e. the transmission axis of the polarizing plate beside the backlight. That is, it is preferable that the bottom 52b of the second contact hole 52 have a shape including two orthogonal sides. This makes it possible to reduce leakage of light during a black display by placing the transmission axes of the pair of polarizing plates parallel to these two sides. As is clear from the foregoing description, leakage of light can be better reduced than in a case where a bottom of a contact hole has a circular shape, provided at least part of the bottom 52b of the second contact hole 52 has two orthogonal sides.

Meanwhile, the first contact hole 51 is filled with a source bus line SBL. Since the source bus line SBL is constituted by metal and hardly transmits light, leakage of light is reduced regardless of the shape of a bottom. For this reason, it is preferable that the shape of the first contact hole 51 be selected from a point of view of being small in size and being able to achieve a reliable connection, and it is preferable that the shape of the first contact hole 51 be a circle.

The shape of the third contact hole 53 depends on the position of formation of the third contact hole 53. In a case where the third contact hole 53 is formed in a position overlapping a gate bus line GL as in the case of the active matrix substrate 200 according to the present embodiment, light is blocked by the gate bus line GL. For this reason, the third contact hole 53 hardly suffers from a problem with leakage of light during a black display. Therefore, as in the case of the first contact hole 51, it is preferable that the third contact hole 53 be selected from a point of view of being small in size and being able to achieve a reliable connection, and it is preferable that the third contact hole 53 be circular. Meanwhile, in a case where the third contact hole 53 is disposed in a region other than a region above a gate bus line, the third contact hole 53 may suffer from a problem with leakage of light during a black display as in the case of the second contact hole 52. For this reason, it is preferable that the bottom 53b of the third contact hole 53 have a shape including two orthogonal sides.

Figure 21:
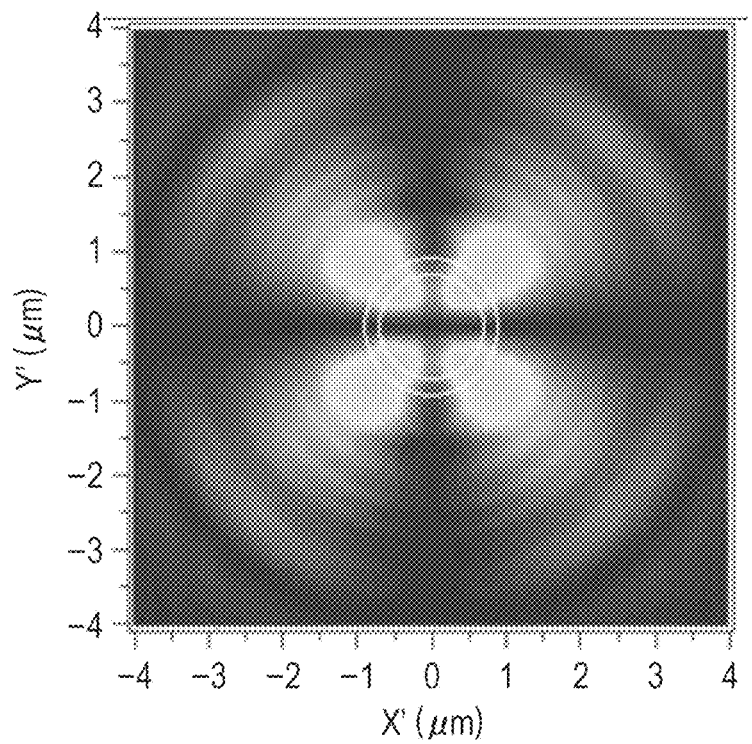
FIG. 21 shows a result of determination by optical simulation of the amount of light that passes through a contact hole of a conventional active matrix substrate.
Figure 22:
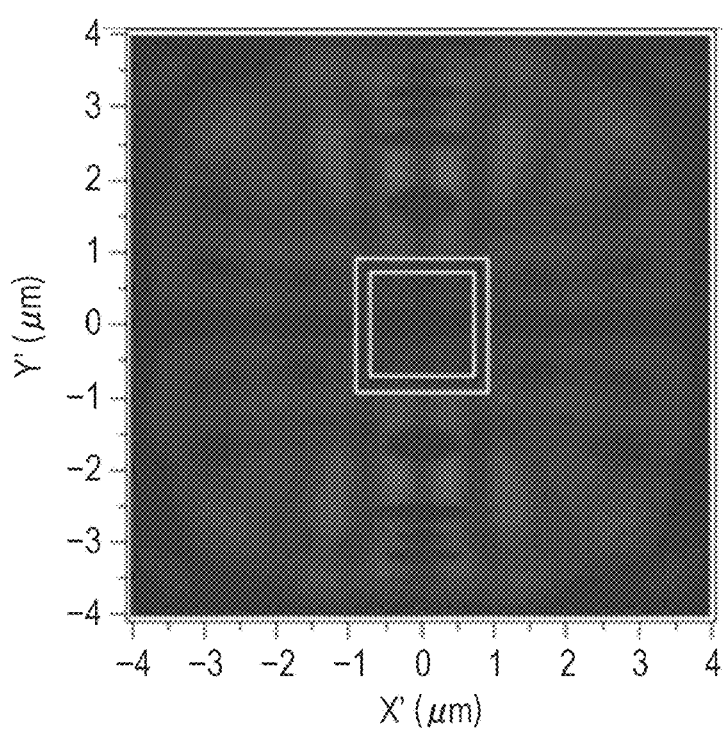
FIG. 22 shows a result of determination by optical simulation of the amount of light that passes through a contact hole according to the present embodiment.

FIGS. 21 and 22 each show a result of determination by optical simulation of the amount of light that passes through an extraction electrode formed in a contact hole. FIG. 21 shows a result obtained in a case where the shape of the bottom of the contact hole is a circle, and FIG. 22 shows a result obtained in a case where the shape of the bottom of the contact hole is a square. In each of FIGS. 21 and 22, the white lines indicate the shapes of the opening and bottom of the contact hole. The taper angle θ of the contact hole is set at 80 degrees. Further, the white regions indicate light corresponding to leakage of light, and whiter regions indicate larger amounts of leakage of light. As shown in FIG. 21, light leaks in directions of ±45 and ±135 degrees with respect to a horizontal direction in a case where the shape of the bottom of the contact hole is a circle. On the other hand, as shown in FIG. 22, little light leaks in a case where the shape of the bottom of the contact hole is a square.

From these results, it is shown that the active matrix substrate 200 according to the present embodiment makes it possible to effectively reduce leakage of light during a black display in a case where the active matrix substrate 200 constitutes a display device.

An active matrix substrate 200 according to the present embodiment can be manufactured by a method that is similar to that by which a common active matrix substrate is manufactured. For example, first, a basecoat film 21 is formed on top of a substrate 10, and a bottom-gate bus line BGL is formed on top of the basecoat film 21. A foundation film 22 is formed on top of the basecoat film 21 so as to cover the bottom-gate bus line BGL. An oxide semiconductor layer 30 is formed on top of the foundation film 22 so as to partially overlap the bottom-gate bus line BGL, and a gate insulating film 27 is formed in a region of the oxide semiconductor layer 30 overlapping the bottom-gate bus line BGL. A source region 30S and a drain region 30D are formed in the oxide semiconductor layer 30. A top-gate bus line TGL is formed in top of the foundation film 22 so as to overlap the bottom-gate bus line BGL to cover the gate insulating film 27.

An interlayer insulating film 24 is formed on top of the foundation film 22 so as to cover the top-gate bus line TGL and a portion of the oxide semiconductor layer 30 exposed from the top-gate bus line TGL. After that, a first contact hole 51 through which to expose part of the source region 30S of the oxide semiconductor layer 30 is formed in the interlayer insulating film 24. The first contact hole 51 can be formed, for example, by forming, on top of the interlayer insulating film 24, a mask having a circular mask in a region in which the first contact hole 51 is formed and subjecting the interlayer insulating film 24, for example, to dry etching with the mask.

After a source bus line SL has been formed inside the first contact hole 51 and on top of the interlayer insulating film 24, a protective film 25 is formed on top of the interlayer insulating film 24 to cover the source bus line SL. A second contact hole 52 through which to expose part of the drain region 30D of the oxide semiconductor layer 30 is formed in the interlayer insulating film 24 and the protective film 25. The second contact hole 52 can be formed, for example, by forming, on top of the protective film 25, a mask having a rectangular mask in a region in which the second contact hole 52 is formed and subjecting the interlayer insulating film 24 and the protective film 25, for example, to dry etching with the mask.

After an extraction electrode 31 has been formed inside the second contact hole 52 and on top of the protective film 25, a second insulating layer 28 is formed on top of the extraction electrode 31 and the protective film 25. Furthermore, after a third contact hole 53 through which to expose part of the extraction electrode 31 has been formed in the second insulating layer 28, a pixel electrode PE is formed inside the third contact hole 53 and on top of the second insulating layer 28. In this way, the active matrix substrate 200 is fabricated.

Second Embodiment

As described in the first embodiment, leakage of light through a contact hole during a black display is attributed to the presence of a difference in transmittance between P-polarized light and S-polarized light in light passing through a transparent extraction electrode formed in the contact hole as shown in FIGS. 17 and 18. As shown in FIG. 18, the transmittance difference between P-polarized light and S-polarized light reaches its maximum when the taper angle θ is nearly 80 degrees. According to a study by the inventors, the taper angle θ of a contact hole in a conventional active matrix substrate is often approximately 80 degrees, and this is considered to be a cause of great leakage of light. As can be seen from FIG. 18, the transmission difference between P-polarized light and S-polarized light becomes smaller regardless of whether the taper angle θ is made smaller than 80 degrees or made larger than 80 degrees.

Figure 23:
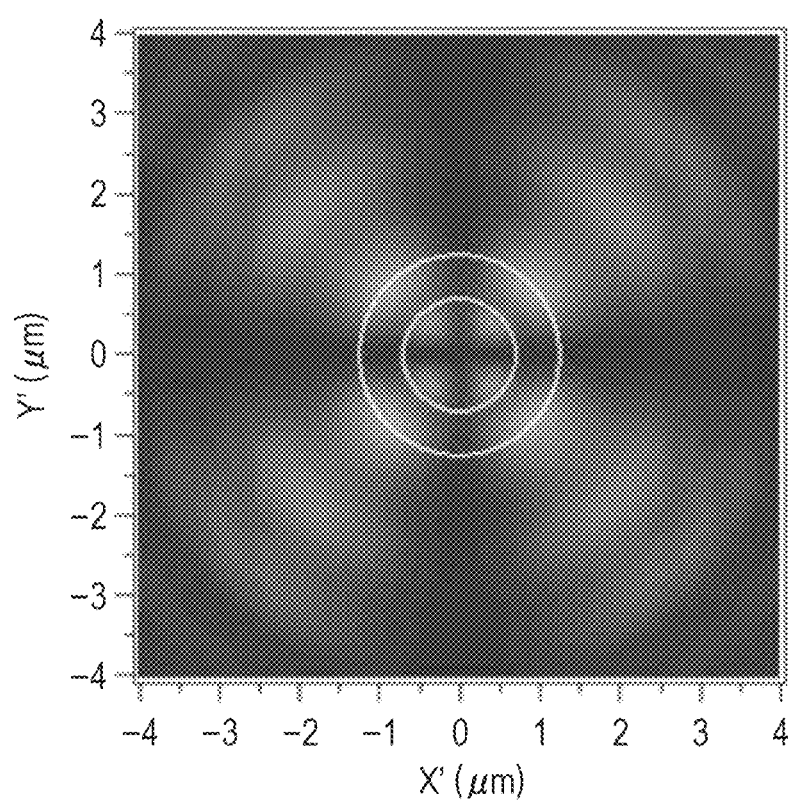
FIG. 23 shows a result of determination by optical simulation of the amount of light that passes through the contact hole in a case where the taper angle $\theta$ is set at 60 degrees.

FIG. 23 shows a result obtained by performing a calculating under the same conditions as those of the optical simulation shown in FIG. 21 except that the taper angle θ was set at 60 degrees. The shape of the bottom of the contact hole is a circle. As shown in FIG. 23, light leaks in directions of ±45 and ±135 degrees with respect to a horizontal direction, and the intensity of the light is smaller than in FIG. 21.

Figure 24:
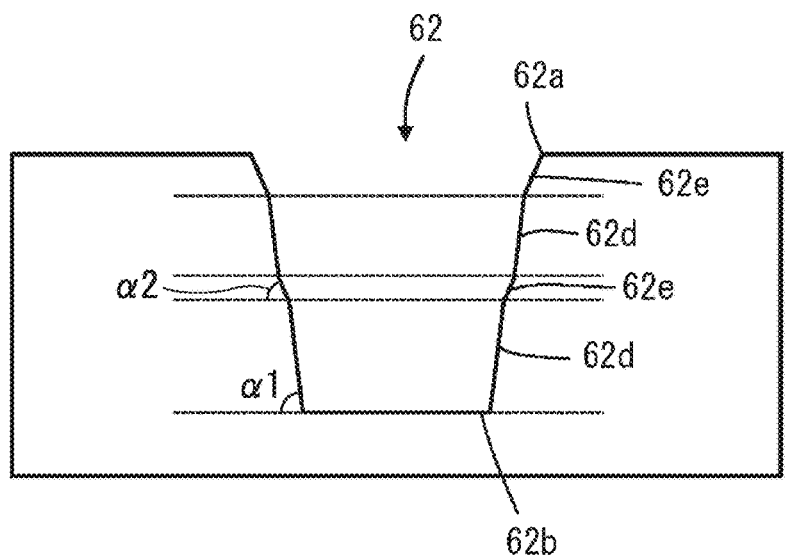
FIG. 24 schematically shows a cross-section of a second contact hole perpendicular to a substrate according to a second embodiment.
Figure 25:
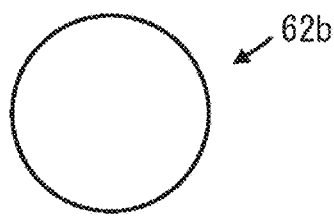
FIG. 25 shows an example of the shape of a bottom of the second contact hole according to the second embodiment in plan view.

FIG. 24 schematically shows a cross-section of a second contact hole 62 of the active matrix substrate according to the present embodiment perpendicular to the substrate 10, and FIG. 25 schematically shows the shape of a bottom of the second contact hole 62 in plan view.

In the active matrix substrate according to the present embodiment, the second contact hole 62 has a stepped side wall. More specifically, the side wall 62c of the second contact hole 62 has, in a cross-section perpendicular to the substrate, a plurality of first inclined portions 62d and a plurality of second inclined portions 62e that are smaller in taper angle, i.e. angle of inclination, with respect to the substrate than the first inclined portions 62d. Since the taper angle of each of the second inclined portions 62e is different from the taper angle of each of the first inclined portions 62d, the side wall is stepped. The plurality of first inclined portions 62d and the plurality of second inclined portions 62e are alternately located in a thickness direction of the first insulating layer 26. The shape of a bottom 62b of the second contact hole 62 is for example a circular shape. Further, the shape of an opening 62a too is a circular shape. The shape of the bottom 62b of the second contact hole 62 may include two orthogonal sides.

Assuming that α1 is the angle of inclination of each of the first inclined portions 62d and α2 is the angle of inclination of each of the second inclined portions 62e, α1>α2 holds. The angles of inclination α1 of the plurality of first inclined portions 62d may be equal to or different from each other. Similarly, the angles of inclination α2 of the plurality of second inclined portions 62e may be equal to or different from each other. Preferably, the angle of inclination α1 of each of the first inclined portions 62d is larger than 80 degrees. Meanwhile, the angle of inclination α2 of each of the second inclined portions 62e is smaller than 80 degrees.

As mentioned above, leakage of light through the second contact hole during a black display may be reduced when the taper angle θ of the contact hole is an angle other than 80 degrees. However, making the taper angle θ of the contact hole smaller than 80 degrees causes the contact hole to have a larger opening and occupy a larger proportion of area in the pixel, and is therefore disadvantageous to achieving a high-resolution display device.

Meanwhile, making the taper angle θ of the contact hole larger than 80 degrees causes the contact hole to occupy a smaller proportion of area in the pixel. However, in forming an extraction electrode inside the contact hole, the thickness of a portion of the extraction electrode that is formed on the side wall tends to become smaller. In particular, when the contact hole becomes deeper, the extraction electrode is not formed in a continuous fashion on the side wall, so that wire breakage may occur.

Since the first inclined portions 62d and the second inclined portions 62e are alternately placed in the thickness direction of the first insulating layer 26, the active matrix substrate according to the present embodiment reduces leakage of light during a black display throughout the second contact hole 62, as even if one of α1 and α2 is approximately 80 degrees, the other is different from 80 degrees. Further, since the first inclined portions 62d, which are large in angle of inclination, do not continue in the thickness direction of the first insulating layer 26, the thinning of the thickness of an extraction electrode that is formed inside the second contact hole 62 and wire breakage are suppressed. In particular, in a case where the angle of inclination α1 of each of the first inclined portions 62*d* is larger than 80 degrees and the angle of inclination α2 of each of the second inclined portions 62*e* is smaller than 80 degrees, the inclined portions 62*d* and the second inclined portions 62*e* can both bring about an effect of reducing leakage of light.

Figure 26:
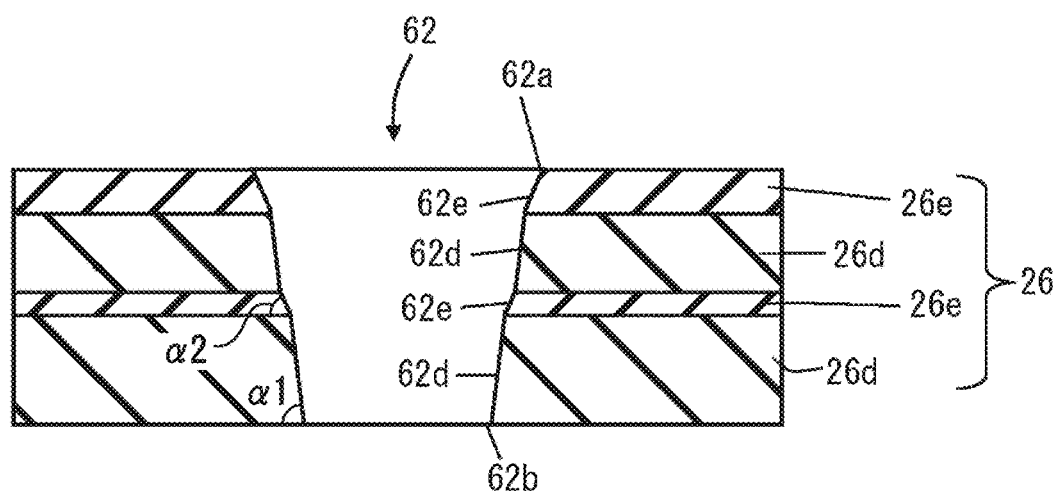
FIG. 26 shows an example of a configuration of a first insulating layer according to the second embodiment.

The aforementioned shape of the second contact hole 62 may be achieved by staking films of two or more types of different materials as the first insulating layer 26 and making the angle of inclination α1 of each of the first inclined portions 62*d* and the angle of inclination α2 of each of the second inclined portions 62*e* different from each other by utilizing the difference in ratio (aspect ratio) of in-depth etching rate to lateral etching rate between films of different materials. FIG. 26 shows an example of a configuration of the first insulating layer 26 according to the second embodiment. As shown in FIG. 26, the first insulating layer 26 includes a plurality of silicon oxide films 26*d* located in portions constituting the first inclined portions 62*d* and a plurality of silicon nitride films 26*e* located in portions constituting the second inclined portions 62*e*, and the plurality of silicon oxide films 26*d* and the plurality of silicon nitride films 26*e* may be alternately stacked. More specifically, the first insulating layer 26 may include a silicon oxide film 26*d* with a thickness of 300 nm, a silicon nitride film 26*e* with a thickness of 100 nm, a silicon oxide film 26*d* with a thickness of 300 nm, and a silicon nitride film 26*e* with a thickness of 150 nm in this order from the bottom 62*b*. For example, in a case where the second contact hole 62 is formed by dry etching, using $COF_2$, $CF_4$, $CHF_3$, $H_2$, $O_2$, Ar, or other gases as an etching gas and adjusting the mixing ratio and flow ratio of these gasses, pressure during etching, discharge power, or other parameters makes it possible to make the angle of inclination α1 of each of the first inclined portions 62*d* and the angle of inclination α2 of each of the second inclined portions 62*e* different from each other or make the angle of inclination α1 of each of the first inclined portions 62*d* larger than 80 degrees and the angle of inclination α2 of each of the second inclined portions 62*e* smaller than 80 degrees.

OTHER EMBODIMENTS

The first and second embodiments can be carried out as appropriate in combination. That is, in the active matrix substrate according to the first embodiment, the shape of the side wall may be configured as described in the second embodiment. Further, in the active matrix substrate according to the second embodiment, the shapes of the bottoms of the first, second, and third contact holes may be configured as described in the first embodiment.

Further, the structures of the active matrix substrates described in the first and second embodiment are just examples, and the structure of an active matrix substrate according to the present disclosure is not limited to the structures described in these embodiments. Specifically, the position and structure of the pixel TFT is not limited to the embodiments disclosed herein, and the thicknesses of the first and second insulating layers and the constitution of materials or other substances are not limited to the embodiments disclosed herein, either.

As described in the first embodiment, the active matrix substrate according to the present embodiment can be suitably used in a liquid crystal display device. In addition, the active matrix substrate according to the present embodiment can also be applied to an organic EL display device. In the case of an organic EL display device, extraneous light may enter the organic EL display device, be reflected off the active matrix substrate, and exit to make it hard to view an image displayed by the pixels. In order to suppress such reflection of outside light, an organic EL display device may employ a structure that suppresses reflection of outside light using a polarizing plate. The effect of the difference in transmittance between P-polarized light and S-polarized light in a contact hole described in the first embodiment also holds in a case where light travels in the opposite direction. Accordingly, it is conceivable that in an organic EL display device too, a change in direction of polarization of extraneous incident light in the contact hole may make it very difficult to control reflected light based on outside light by a polarizing plate as intended. In such a case, employing the active matrix substrate according to the first or second embodiment makes it possible to reduce the effect of reflected light based on outside light.

An active matrix substrate and a liquid crystal display device according to the present disclosure can also be described in the following manner.

An active matrix substrate according to a first configuration includes a substrate having a display region including a plurality of pixel regions and a non-display region provided around the display region, a plurality of source bus lines extending in a first direction in the display region, and a plurality of gate bus lines extending in a second direction intersecting the first direction. Provided in each of the pixel regions are a pixel TFT including an oxide semiconductor layer having a source region and a drain region, a first insulating layer disposed to cover at least the oxide semiconductor layer, an extraction electrode, disposed on top of the first insulating layer, that includes a transparent conductive film, and a pixel electrode disposed above the extraction electrode and electrically connected to the extraction electrode. The first insulating layer includes a first contact hole located above the source region and a second contact hole located above the drain region. Part of one of the plurality of source bus lines overlaps part of the source region and is connected to the source region of the oxide semiconductor layer via the first contact hole. The extraction electrode is connected to the drain region of the oxide semiconductor layer via the second contact hole. A shape of a bottom of the first contact hole is different from a shape of a bottom of the second contact hole, and the shape of the bottom of the second contact hole includes two orthogonal sides.

According to the first configuration, in which the shape of the bottom of the second contact hole includes two orthogonal sides, makes it possible to reduce leakage of light through the contact hole during a black display by placing a pair of polarizing plates having transmission axes parallel to these two sides.

An active matrix substrate according to a second configuration may be directed to the first configuration, wherein the shape of the bottom of the first contact hole is a circle. According to the second configuration, in which the shape of the bottom of the first contact hole is a circle, makes it possible to reduce the area of the first contact hole.

An active matrix substrate according to a third configuration may be directed to the first configuration, wherein the shape of the bottom of the second contact hole is a rectangle.

An active matrix substrate according to a fourth configuration includes a substrate having a display region including a plurality of pixel regions and a non-display region provided around the display region, a plurality of source bus lines extending in a first direction in the display region, and a plurality of gate bus lines extending in a second direction intersecting the first direction. Provided in each of the pixel regions are a pixel TFT including an oxide semiconductor layer having a source region and a drain region, a first insulating layer disposed to cover at least the oxide semiconductor layer, an extraction electrode, disposed on top of the first insulating layer, that includes a transparent conductive film, and a pixel electrode disposed above the extraction electrode and electrically connected to the extraction electrode. The first insulating layer includes a first contact hole located above the source region and a second contact hole located above the drain region. Part of one of the plurality of source bus lines overlaps part of the source region and is connected to the source region of the oxide semiconductor layer via the first contact hole. The extraction electrode is connected to the drain region of the oxide semiconductor layer via the second contact hole. The second contact hole has a stepped side wall.

According to the fourth configuration, in which the second contact hole has a stepped side wall, makes it possible to reduce leakage of light through the contact hole during a black display.

An active matrix substrate according to a fifth configuration may be directed to the fourth configuration, wherein the side wall of the second contact hole has, in a cross-section perpendicular to the substrate, a plurality of first inclined portions and a plurality of second inclined portions that are smaller in angle of inclination with respect to the substrate than the first inclined portions, and the plurality of first inclined portions and the plurality of second inclined portions are alternately located in a thickness direction of the first insulating layer.

An active matrix substrate according to a sixth configuration may be directed to the fifth configuration, wherein the angle of inclination of each of the first inclined portions is larger than 80 degrees.

An active matrix substrate according to a seventh configuration may be directed to the fifth or sixth configuration, wherein the angle of inclination of each of the second inclined portions is smaller than 80 degrees. The fifth to seventh configurations make it possible to more certainly reduce leakage of light through the contact hole during a black display.

An active matrix substrate according to an eighth configuration may be directed to the fourth to seventh configurations, wherein a shape of a bottom of the second contact hole is a circle. According to the eighth configuration, in which the shape of the bottom of the second contact hole is a circle, makes it possible to reduce the area of the second contact hole.

An active matrix substrate according to a ninth configuration may be directed to the fourth to seventh configurations, wherein a shape of a bottom of the second contact hole is a rectangle. The ninth configuration makes it possible to more certainly reduce leakage of light through the contact hole during a black display.

An active matrix substrate according to a tenth configuration is directed to the first to ninth configurations, wherein the plurality of gate bus lines include a plurality of top-gate bus lines and a plurality of bottom-gate bus lines, and in a plan view, one of the plurality of top-gate bus lines is located above and overlaps one of the plurality of bottom-gate bus lines. The pixel TFT may include part of one of the plurality of top-gate bus lines and part of one of the plurality of bottom-gate bus lines as a top gate and a bottom gate, respectively.

An active matrix substrate according to a eleventh configuration may be directed to the first to tenth configurations, further including a second insulating layer located on top of the extraction electrode and the first insulating layer. The pixel electrode may be located on top of the second insulating layer, and the second insulating layer may include a third contact hole. The pixel electrode may be connected to the source region of the oxide semiconductor layer via the third contact hole.

An active matrix substrate according to a twelfth configuration may be directed to the eleventh configuration, wherein the third contact hole is located on top of part of one of the top-gate bus lines, and a shape of a bottom of the third contact hole is a circle.

An active matrix substrate according to a thirteenth configuration may be directed to the eleventh configuration, wherein the third contact hole is located in a region other than on top of the top-gate bus lines, and a shape of a bottom of the third contact hole is a rectangle.

An active matrix substrate according to a fourteenth configuration may be directed to the first to thirteenth configurations, further including a driving circuit located in the non-display region of the substrate, wherein the driving circuit includes a plurality of TFTs each including a polycrystalline semiconductor layer.

A liquid crystal display device according to a fifteenth configuration includes the active matrix substrate according to the first to third configuration, a counter substrate located opposite the active matrix substrate, a liquid crystal layer located between the active matrix substrate and the counter substrate, and a pair of polarizing plates facing each other across at least the liquid crystal layer. The pair of polarizing plates are under crossed-nicols arrangement, and the pair of polarizing plates have polarizing axes parallel to two orthogonal sides of the bottom of the second contact hole, respectively.

A liquid crystal display device according to a sixteenth configuration includes the active matrix substrate according to the fourth to ninth configuration, a counter substrate located opposite the active matrix substrate, a liquid crystal layer located between the active matrix substrate and the counter substrate, and a pair of polarizing plates facing each other across at least the liquid crystal layer.

The fifteenth and sixteenth configurations make it possible to reduce leakage of light through the contact hole during a black display.

An active matrix substrate according to an embodiment of the present disclosure is suitably used in a liquid crystal display device that is used in a head-mounted display, a smartphone, or other devices. Further, without being limited to a liquid crystal display device, the active matrix substrate is suitably used in various types of display device such as an organic EL display device.

The present disclosure contains subject matter related to that disclosed in Japanese Priority Patent Application JP 2022-015797 filed in the Japan Patent Office on Feb. 3, 2022, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
   a substrate having a display region comprising a plurality of pixel regions and a non-display region provided around the display region;
   a plurality of source bus lines extending in a first direction in the display region; and a plurality of gate bus lines extending in a second direction intersecting the first direction,
in each of the plurality of pixel regions, the active matrix substrate further comprising:
a pixel Thin Film Transistor (TFT) comprising an oxide semiconductor layer that is transparent and that has having a source region and a drain region;
a first insulating layer disposed such that to cover at least the oxide semiconductor layer;
an extraction electrode disposed on top of the first insulating layer and comprising a transparent conductive film; and
a pixel electrode disposed above the extraction electrode and electrically connected to the extraction electrode,
wherein
the first insulating layer comprises a first contact hole located above the source region and a second contact hole located above the drain region,
a part of one of the plurality of source bus lines overlaps a part of the source region and is connected to the source region of the oxide semiconductor layer via the first contact hole,
the extraction electrode is connected to the drain region of the oxide semiconductor layer via the second contact hole, and
a shape of a bottom of the first contact hole is different from a shape of a bottom of the second contact hole, such that
the shape of the bottom of the first contact hole is a circle, and
the shape of the bottom of the second contact hole is a rectangle.

2. An active matrix substrate comprising:
a substrate having a display region comprising a plurality of pixel regions and a non-display region provided around the display region;
a plurality of source bus lines extending in a first direction in the display region; and
a plurality of gate bus lines extending in a second direction intersecting the first direction,
in each of the plurality of pixel regions, the active matrix substrate further comprising:
a pixel Thin Film Transistor (TFT) comprising an oxide semiconductor layer that is transparent and that has a source region and a drain region;
a first insulating layer disposed such that to cover at least the oxide semiconductor layer;
an extraction electrode disposed on top of the first insulating layer and comprising a transparent conductive film; and
a pixel electrode disposed above the extraction electrode and electrically connected to the extraction electrode,
wherein
the first insulating layer comprises a first contact hole located above the source region and a second contact hole located above the drain region,
a part of one of the plurality of source bus lines overlaps a part of the source region and is connected to the source region of the oxide semiconductor layer via the first contact hole,
the extraction electrode is connected to the drain region of the oxide semiconductor layer via the second contact hole,
the second contact hole has a stepped side wall,
the stepped side wall of the second contact hole has, in a cross-section perpendicular to the substrate, a plurality of first inclined portions and a plurality of second inclined portions,
the plurality of second inclined portions is smaller, in an angle of inclination with respect to the substrate, than the plurality of first inclined portions, and
the plurality of first inclined portions and the plurality of second inclined portions are alternately located in a thickness direction of the first insulating layer.

3. The active matrix substrate according to claim 2, wherein the angle of inclination of each of the plurality of first inclined portions is larger than 80 degrees.

4. The active matrix substrate according to claim 3, wherein the angle of inclination of each of the plurality of second inclined portions is smaller than 80 degrees.

5. The active matrix substrate according to claim 2, wherein a shape of a bottom of the second contact hole is a circle.

6. The active matrix substrate according to claim 2, wherein a shape of a bottom of the second contact hole is a rectangle.

7. The active matrix substrate according to claim 1, wherein
the plurality of gate bus lines comprises a plurality of top-gate bus lines and a plurality of bottom-gate bus lines,
in a plan view, one of the plurality of top-gate bus lines is located above and overlaps one of the plurality of bottom-gate bus lines, and
the pixel TFT comprises a part of one of the plurality of top-gate bus lines and a part of one of the plurality of bottom-gate bus lines as a top gate and a bottom gate, respectively.

8. The active matrix substrate according to claim 1, further comprising a second insulating layer located on top of the extraction electrode and the first insulating layer, wherein
the pixel electrode is located on top of the second insulating layer,
the second insulating layer comprises a third contact hole, and
the pixel electrode is connected to the extraction electrode via the third contact hole.

9. The active matrix substrate according to claim 8, wherein
the plurality of gate bus lines comprises a plurality of top-gate bus lines and a plurality of bottom-gate bus lines,
the third contact hole is located on top of a part of one of the plurality of top-gate bus lines, and
a shape of a bottom of the third contact hole is a circle.

10. The active matrix substrate according to claim 8, wherein
the plurality of gate bus lines comprises a plurality of top-gate bus lines and a plurality of bottom-gate bus lines,
the third contact hole is located in a region other than on top of the plurality of top-gate bus lines, and
a shape of a bottom of the third contact hole is a rectangle.

11. The active matrix substrate according to claim 1, further comprising a driving circuit located in the non-display region of the substrate,
wherein the driving circuit comprises a plurality of TFTs each comprising a polycrystalline semiconductor layer.

12. A liquid crystal display device comprising:
the active matrix substrate according to claim 2;

a counter substrate located opposite the active matrix substrate;
a liquid crystal layer located between the active matrix substrate and the counter substrate; and
a pair of polarizing plates facing each other across at least the liquid crystal layer.

13. A liquid crystal display device comprising:
an active matrix substrate comprising:
　a substrate having a display region comprising a plurality of pixel regions and a non-display region provided around the display region;
　a plurality of source bus lines extending in a first direction in the display region;
　a plurality of gate bus lines extending in a second direction intersecting the first direction,
　in each of the plurality of pixel regions, the active matrix substrate further comprising:
　　a pixel Thin Film Transistor (TFT) comprising an oxide semiconductor layer that is transparent and that has a source region and a drain region;
　　a first insulating layer disposed such that to cover at least the oxide semiconductor layer;
　　an extraction electrode disposed on top of the first insulating layer and comprising a transparent conductive film; and
　　a pixel electrode disposed above the extraction electrode and electrically connected to the extraction electrode;
a counter substrate located opposite the active matrix substrate;
a liquid crystal layer located between the active matrix substrate and the counter substrate; and
a pair of polarizing plates facing each other across at least the liquid crystal layer,
wherein
the first insulating layer comprises a first contact hole located above the source region and a second contact hole located above the drain region,
a part of one of the plurality of source bus lines overlaps a part of the source region and is connected to the source region of the oxide semiconductor layer via the first contact hole,
the extraction electrode is connected to the drain region of the oxide semiconductor layer via the second contact hole,
a shape of a bottom of the first contact hole is different from a shape of a bottom of the second contact hole,
the shape of the bottom of the second contact hole comprises two orthogonal sides,
the pair of polarizing plates is under a crossed-nicols arrangement, and
the pair of polarizing plates has polarizing axes parallel to the two orthogonal sides of the bottom of the second contact hole, respectively.

14. The liquid crystal display device according to claim 13, wherein the shape of the bottom of the first contact hole is a circle.

15. The liquid crystal display device according to claim 13, wherein the shape of the bottom of the second contact hole is a rectangle.

16. The liquid crystal display device according to claim 13, wherein
　the plurality of gate bus lines comprises a plurality of top-gate bus lines and a plurality of bottom-gate bus lines,
　in a plan view, one of the plurality of top-gate bus lines is located above and overlaps one of the plurality of bottom-gate bus lines, and
　the pixel TFT comprises a part of one of the plurality of top-gate bus lines and a part of one of the plurality of bottom-gate bus lines as a top gate and a bottom gate, respectively.

17. The liquid crystal display device according to claim 13, wherein
　the active matrix substrate further comprises a second insulating layer located on top of the extraction electrode and the first insulating layer,
　the pixel electrode is located on top of the second insulating layer,
　the second insulating layer comprises a third contact hole, and
　the pixel electrode is connected to the extraction electrode via the third contact hole.

18. The liquid crystal display device according to claim 17, wherein
　the plurality of gate bus lines comprises a plurality of top-gate bus lines and a plurality of bottom-gate bus lines,
　the third contact hole is located on top of a part of one of the plurality of top-gate bus lines, and
　a shape of a bottom of the third contact hole is a circle.

19. The liquid crystal display device according to claim 17, wherein
　the plurality of gate bus lines comprises a plurality of top-gate bus lines and a plurality of bottom-gate bus lines,
　the third contact hole is located in a region other than on top of the plurality of top-gate bus lines, and
　a shape of a bottom of the third contact hole is a rectangle.

20. The liquid crystal display device according to claim 13, wherein
　the active matrix substrate further comprises a driving circuit located in the non-display region of the substrate, and
　the driving circuit comprises a plurality of TFTs each comprising a polycrystalline semiconductor layer.

* * * * *